US006642578B1

(12) United States Patent
Arnold et al.

(10) Patent No.: US 6,642,578 B1

(45) Date of Patent: Nov. 4, 2003

(54) LINEARITY RADIO FREQUENCY SWITCH WITH LOW CONTROL VOLTAGE

(75) Inventors: Brian Scott Arnold, Dallas, TX (US); Steven William Cooper, Blue Ridge, TX (US)

(73) Assignee: Anadigics, Inc., Warren, NJ (US)

( * ) Notice: Subject to any disclaimer, the term of this patent is extended or adjusted under 35 U.S.C. 154(b) by 0 days.

(21) Appl. No.: 10/201,494

(22) Filed: Jul. 22, 2002

(51) Int. Cl.[7] .................................................. H03B 1/00

(52) U.S. Cl. ........................ 257/341; 327/108; 327/111

(58) Field of Search .......................... 257/341; 327/108, 327/111

(56) References Cited

U.S. PATENT DOCUMENTS 3,586,930 A 6/1971 Das et al.
3,760,492 A 9/1973 Middelhoek et al.
3,855,613 A 12/1974 Napoli et al.
4,034,399 A 7/1977 Drukier et al.
4,241,316 A * 12/1980 Knapp
4,380,022 A 4/1983 Yoder
4,408,384 A 10/1983 Lowis et al.
4,409,608 A 10/1983 Yoder
4,462,041 A 7/1984 Glenn
4,574,208 A 3/1986 Lade et al.
4,599,576 A 7/1986 Yoshida et al.
4,879,582 A 11/1989 Kimura et al.
5,025,296 A 6/1991 Fullerton et al.
5,160,984 A 11/1992 Mochizuki et al.
5,283,452 A 2/1994 Shih et al.
5,313,083 A 5/1994 Schindler
5,451,536 A 9/1995 Redwine
5,528,065 A 6/1996 Battersby et al.
5,563,439 A 10/1996 Chung et al.
5,614,762 A 3/1997 Kanamori et al.
5,652,452 A 7/1997 Asano
5,719,429 A 2/1998 Yoshida et al.
5,789,791 A 8/1998 Bergemont
5,828,102 A 10/1998 Bergemont
5,834,802 A 11/1998 Takahashi et al.
5,883,407 A 3/1999 Kunii et al.
5,955,763 A 9/1999 Lin
6,020,613 A 2/2000 Udomoto et al.
6,084,277 A 7/2000 Disney et al.
6,114,732 A 9/2000 Sugimura et al.
6,218,890 B1 4/2001 Yamaguchi et al.
6,255,679 B1 7/2001 Akiba
6,268,632 B1 7/2001 Sugimura et al.
6,274,896 B1 8/2001 Gibson et al.
6,303,950 B1 10/2001 Kurusu et al.
6,563,351 B2 * 5/2003 Onizawa et al.

OTHER PUBLICATIONS

Tanaka, S. et al., "A 3V MMIC Chip Set for 1.9 GHz Mobile Communication Systems," ISSCC95 Digest of Technical Papers 144–45 (1995).

* cited by examiner

*Primary Examiner*—Fetsum Abraham
(74) *Attorney, Agent, or Firm*—Pennie & Edmonds LLP

(57) ABSTRACT

A field effect transistor used in radio frequency switching applications and having a linear performance characteristic is disclosed. The transistor comprises a plurality of gate lines, a source terminal, a drain terminal, and two feed forward capacitors electrically coupled to the source and drain terminals and the gate line at a plurality of points along the line. An improved transistor preferably includes three or more gate lines to help improve harmonic suppression.

20 Claims, 5 Drawing Sheets

LINEARITY RADIO FREQUENCY SWITCH WITH LOW CONTROL VOLTAGE

FIELD OF THE INVENTION

The present invention relates to depletion mode field effect transistors. More specifically, the invention relates to a high power transistor suitable for use as a radio frequency switch in wireless telephony applications.

BACKGROUND OF THE INVENTION

Field effect transistors (FETs) are semiconductor devices that are used in a variety of switching applications. For example, in radio frequency applications, one can connect FETs in a series-shunt combination to provide a single pole, double throw (SPDT) switch. Cellular telephones use such a switch to alternately connect the radio transmitter or receiver portion of the phone to the antenna. In such a switch, four FETs are used. Two act as series connected devices, one to connect either the receiver or transmitter to the antenna and the other to isolate the transmitter or receiver from the antenna. The other two FETs are used to shunt undesired signals from the isolated receiver or transmitter to ground.

A FET typically has three electrical terminals: a source, a drain, and a gate. When a FET is used as a switch, the switch input is the drain and the switch output is the source, or vice-versa. The switched signal passes through a conductive region, called the channel. In a depletion mode FET (i.e., a FET that is normally on), a control voltage is applied to the gate (or between the gate and the source) to turn the device off. The level of voltage sufficient to turn the device off is known as the pinch-off voltage ($V_{po}$). When the pinch-off voltage is applied to the gate, the free carriers of electrical current are depleted in the channel region, rendering the semiconductor material in the channel non-conductive. A channel in this condition prevents signal current from passing between the source and drain terminals. The free carriers in the channel can also be depleted by an excessive amount of signal current. This type of depletion is known as saturation. Saturation occurs gradually along the length of the channel. The zero voltage (present at the gate) saturation current is known as $I_{dss}$. In any-given channel, if its length, i.e., the distance between the source and drain terminals, is decreased, then the $I_{dss}$ for the transistor increases.

In order to increase the current carrying capacity of the entire FET, several channels may be formed between the interdigitated fingers of alternating source and drain terminals. By increasing the number of fingers and channels created between them, and by increasing the peripheral area of the channels, with each channel having a maximized current capacity $I_{dss}$, the power capacity of the entire FET can be increased. The power capacity is important in an SPDT switch application for the series connected FETs.

One of the most challenging specifications that a radio frequency (RF) switch used in commercial wireless applications must meet is linearity. Typically, the linearity of a series FET used in a switch is determined by its on state and off state harmonic suppression. However, linearity specifications can refer to the gain compression, third-order intercept point, the harmonic suppression of the switch, or a combination of these measures. Of these, harmonic suppression performance is the more difficult linearity specification to attain. Indeed, harmonic suppression is by far the most difficult, although important, aspect of linearity to meet in modern handset applications. In particular, high power Global System for Mobile Communications (GSM)/Digital Communication System (DCS) antenna switch specifications refer only to harmonic suppression in their linearity requirements.

On State Harmonic Performance

In order to improve the linear performance of a series FET when it passes a signal through it (i.e., when it is turned on), the $I_{dss}$ of the channel is increased. The "on state" series device in a switch must have a sufficient gate periphery to pass the short circuit RF current without distortion. This linearity factor is directly related to the $I_{dss}$. Several methods are used in radio frequency applications to increase $I_{dss}$. Gallium arsenide is commonly used as the base semiconductor material in radio frequency applications because it has the physical property of containing free carriers with higher mobility, which leads to an increased $I_{dss}$. In the physical arrangement of a typical gallium arsenide FET, the gate consists of a conductive layer placed above the channel, between the ohmic connection points for the source and drain. By using a metal gate, better known as a Schottky barrier (as in a MESFET) rather than a junction (as in a JFET), the channel length can be further reduced. These approaches are combined to cooperatively increase the $I_{dss}$ of each channel.

To increase the gate periphery, typically the gate is laid down between the interdigitated source and drain fingers and around the ends of each finger, separating the source and the drain and covering the channel. Since the gate metalization spans the length of the channel, a decreased channel length produces a relatively narrow gate path. The narrow gate length increases the gate's impedance per unit of gate line. The gate appears as a long, serpentine line. This layout reduces the total area used by the device in an integrated circuit. By increasing the periphery of the series FET, the desired harmonic suppression for a given RF power level can be achieved at the expense of area used.

Off State Harmonic Performance

One problem associated with the series FET and the shunt FET occurs when the blocked RF signal voltage is of sufficient amplitude to overcome the desired effect of the control voltage applied to the gate (i.e., to inhibit the passage of the RF signal). An intrinsic capacitance between the gate and the drain, denoted $C_{gd}$, and also between the gate and the source, denoted $C_{gs}$, provides an electrical path for the signal to override the control voltage. These intrinsic capacitances act as conductors to superimpose the signal voltage over the control voltage at the gate. The linearity of the FET is determined by the difference between the pinch-off voltage ($V_{po}$) and the control voltage applied to the switch. If the superimposed signal voltage is of sufficient magnitude to decrease the control gate voltage below $V_{po}$, the gate will no longer be able to hold the FET off, and the signal will pass through the FET. Thus, a signal of sufficient magnitude can reverse a FET gated off and at least partially turn it back on. When a FET is undesirably turned on in this manner, harmonic signals are generated due to nonlinear characteristics of the device when operated with a control voltage near $V_{po}$. These harmonic signals have frequencies two or more times the base frequency of the signal. Thus, the ability of the FET to suppress generation of harmonic signals may be impaired by the presence of this intrinsic capacitance.

In the prior art, the use of multiple gates addressed this problem by dividing the superimposed signal magnitude at each gate. Thus, if two gates were provided, the signal across each gate would be cut in half. Therefore, a signal of twice the magnitude as a signal that would overcome a single gate device would be required to overcome the control voltage and turn the dual gate FET back on. Because both gate lines must fit within the length of the channel, the lines will be narrower as well. Spacing between the lines narrowed the gate lines even further and the impedance per unit gate line increased. Because the control voltages used in modern cellular phones are typically on the order of three volts, this control voltage is insufficient to keep the FET pinched off under the stress of the RF signal, resulting in the production of unwanted harmonics, even with the benefit of multiple gates.

Another prior art solution that improved the linear performance of a multiple gate FET employed two feed forward capacitors connected between the drain and the gate nearest to the drain or between the source and the most proximal gate to the source respectively. The capacitors perform the same function of superimposing the signal over the gate voltage as the intrinsic capacitance. The capacitors are selected to have a low impedance at the signal operating frequency. During the portion of the radio frequency cycle when the signal voltage applied to the adjacent terminal has a polarity opposite that of the control voltage applied to the gate, the gate nearest the respective signal terminal is turned on by a feed forward signal injected at the gate, as in the intrinsic capacitance example given above. However, the signal applied to the gate nearest the opposite terminal is aided by the respective feed forward signal, and is kept off by this feed forward signal. This gate is helped by the signal because the signal has the same polarity as the control voltage on this side of the FET. The signal assists the control voltage to keep the portion of the channel beneath this gate depleted, thus suppressing the generation of undesirable harmonics.

For example, Tanaka, S. et al., "A 3V MMIC Chip Set for 1.9 GHz Mobile Communication Systems," ISSCC95 Digest of Technical Papers 144–45 (1995) describe the use of feed forward capacitors to improve harmonic performance. The reference demonstrates the use of feed forward capacitors in a dual gate gallium arsenide FET switch. Unfortunately, the use of feed forward capacitors in dual gate FETs is not sufficient to yield a FET having the linear performance required by industry specifications. For instance, the linear performance presented in the above reference, specifically −1 dB gain compression, does not meet current GSM/DCS linearity specifications and Tanaka et al. do not consider the harmonic performance of the FET.

FIG. 1 illustrates the physical layout of a typical prior art triple gate FET. Each gate line 150, 151, 152 is a long, narrow, serpentine path with a relatively high impedance along the path. The feed forward signal passes from the respective terminal 125 and 135 through the feed forward capacitor 120 and 130 and is injected at one end of the proximal gate line 110 and 140. Because of the gate line impedance, the feed forward signal attenuates as it travels down the gate line. The portion of the gates covering the last channel 160 has the weakest support from the feed-forward signal, and thus this channel has the least harmonic suppression. This end of the FET causes the FET to fail harmonic suppression performance requirements, the most difficult aspect of linearity to meet in modern handset applications. This problem is more prominent in large periphery FETs that must be sized large enough to pass the "on state" RF current without distortion. For these FETs, generally used as the series FET in a switch, the harmonic suppression degradation is catastrophic at a control voltage of 2.7 Vdc, rendering the FET unusable.

SUMMARY OF THE INVENTION

The present invention overcomes the aforementioned problems of poor harmonic suppression in FETs using multiple gates or feed forward capacitors in high power radio frequency applications. These problems occur because of the relatively long gate line and the end-injection of the feed forward signal. As noted previously, a longer gate line is necessary because of the expanded periphery and larger number of interdigitated source and drain fingers used to increase the amount of current that the FET can handle in high power applications. The present invention improves the linear performance of a field effect transistor with multiple gates and feed forward capacitors by injecting the feed forward signal at multiple points along the gate line. By making these electrical connections, the feed forward signal attenuation on the gate line leading to nonlinear performance is overcome resulting in a relatively equal magnitude of the feed forward voltage supplied by the capacitors across the entire gate periphery of the FET.

In one aspect, the invention provides a field effect transistor having a plurality of gate lines, a source terminal, a drain terminal and feed forward capacitors electrically coupled to each terminal, wherein each feed forward capacitor is electrically coupled to at least one gate line at a plurality of points along the length of the gate line. In one embodiment, the transistor has the connections spaced no more than 400 microns apart along the length of the coupled gate line. Alternative embodiments space the connections no more than 100 microns, 200 microns, 250 microns, 300 microns, 350 microns, 380 microns, 420 microns, 450 microns, and 500 microns apart. It is also preferred that the source and drain feed forward capacitors are coupled to the gate line near the respective source or drain fingers, and most preferably nearest the respective source or drain fingers.

In an alternative embodiment, none of the first plurality of points are on the same gate line as one of the points from the second plurality of points.

In another embodiment of the invention, the first capacitor is coupled at the second end to the gate line nearest to the source finger and the second capacitor is coupled at the second end to the gate line nearest to the drain finger. In an alternative embodiment, the transistor comprises three or more gate lines.

In another embodiment of the invention, the transistor has a periphery of at least 400 microns.

In another embodiment, the capacitance of the first and second feed forward capacitors correspond to a harmonic suppression of second and third harmonics of less than −30 dBm at 1000 MHz with an applied control voltage of 2.5 Vdc to 3.5 Vdc. In an alternative embodiment, the capacitance of the first and second feed forward capacitors correspond to an insertion loss of the transistor of less than 0.25 dB at 1000 MHz and 2000 MHz with an applied control voltage of 2.5 Vdc to 3.5 Vdc.

In another embodiment of the invention, the transistor has a substrate material comprising gallium arsenide. In an alternative embodiment, the transistor is prepared using a pseudomorphic high electron mobility process. In another alternative embodiment, the gate line is a Schottky barrier. In another alternative embodiment, the gate line is a junction.

In another embodiment of the invention, the transistor's source and drain terminals are electrically coupled to a plurality of interdigitated source and drain fingers respectively.

The invention also provides for a method of switching a radio frequency signal having a signal strength of greater than 24 dBm and preferably up to 35.5 dBm, comprising providing a field effect transistor as a series switching device, the transistor comprising a plurality of gate lines, a source terminal electrically coupled to a source finger, a drain terminal electrically coupled to a drain finger, a first end of a first feed forward capacitor electrically coupled to the source terminal and at a second end electrically coupled to at least one gate line at a first plurality of points along the line, and, a first end of a second feed forward capacitor electrically coupled to the drain terminal and at a second end electrically coupled to at least one gate line at a second plurality of points along the line. Alternatively, the method may include switching the transistor with a 2.5 Vdc to 3.5 Vdc control signal and wherein the transistor's harmonic suppression of second and third harmonics is less than −30 dBm at 1000 MHz.

Other objects and features of the present invention will become apparent from the following detailed description considered in conjunction with the accompanying drawings. It is to be understood that the drawings are designed solely for purposes of illustration and not as a definition of the limits of the invention, for which reference should be made to the appended claims.

BRIEF DESCRIPTION OF THE DRAWINGS

The advantages of the present invention will be better understood and more readily apparent when considered in conjunction with the following detailed description and accompanying drawings which illustrate, by way of example, the preferred embodiments of the invention and in which.

DESCRIPTION OF THE PREFERRED EMBODIMENTS

Figure 1:
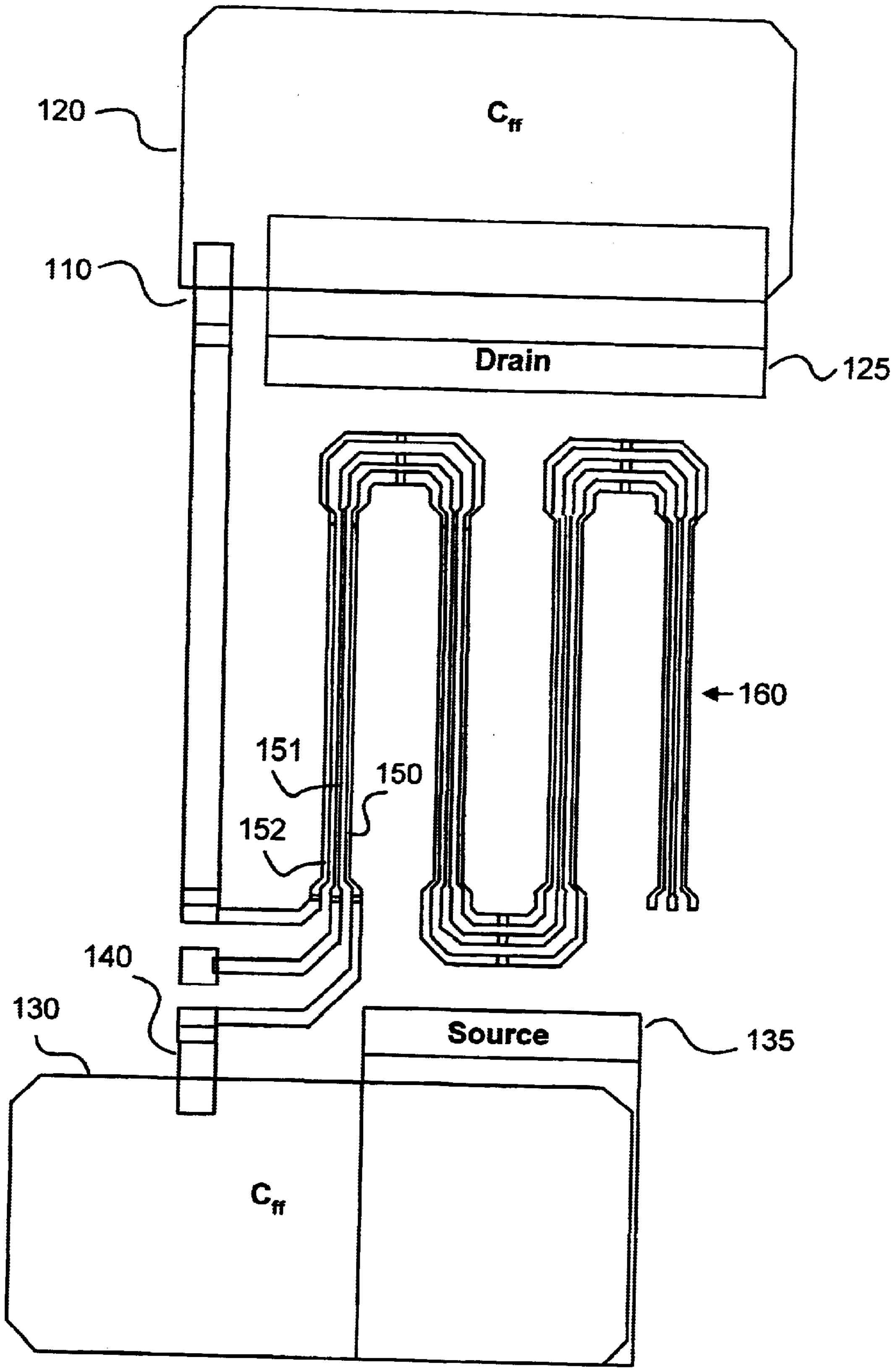
FIG. 1 is a physical layout diagram depicting the prior art feed forward signal injection in a multiple gate FET.

As a preliminary matter, although the invention is described herein as a field effect transistor used as a high-power switch apparatus, it can be used in other field effect transistor applications where harmonic suppression and linear performance are a concern. One of skill in the art will recognize from the following description that the invention may be used in other such applications. One with skill in the art will also recognize that the invention is not limited to a specific number of gate lines, but may be applied where two or more gate lines are present. One must also recognize that the invention is not limited to the geometry of the gate line illustrated in the drawings either, but is applicable where such lines are of a relatively long length.

Figure 2:
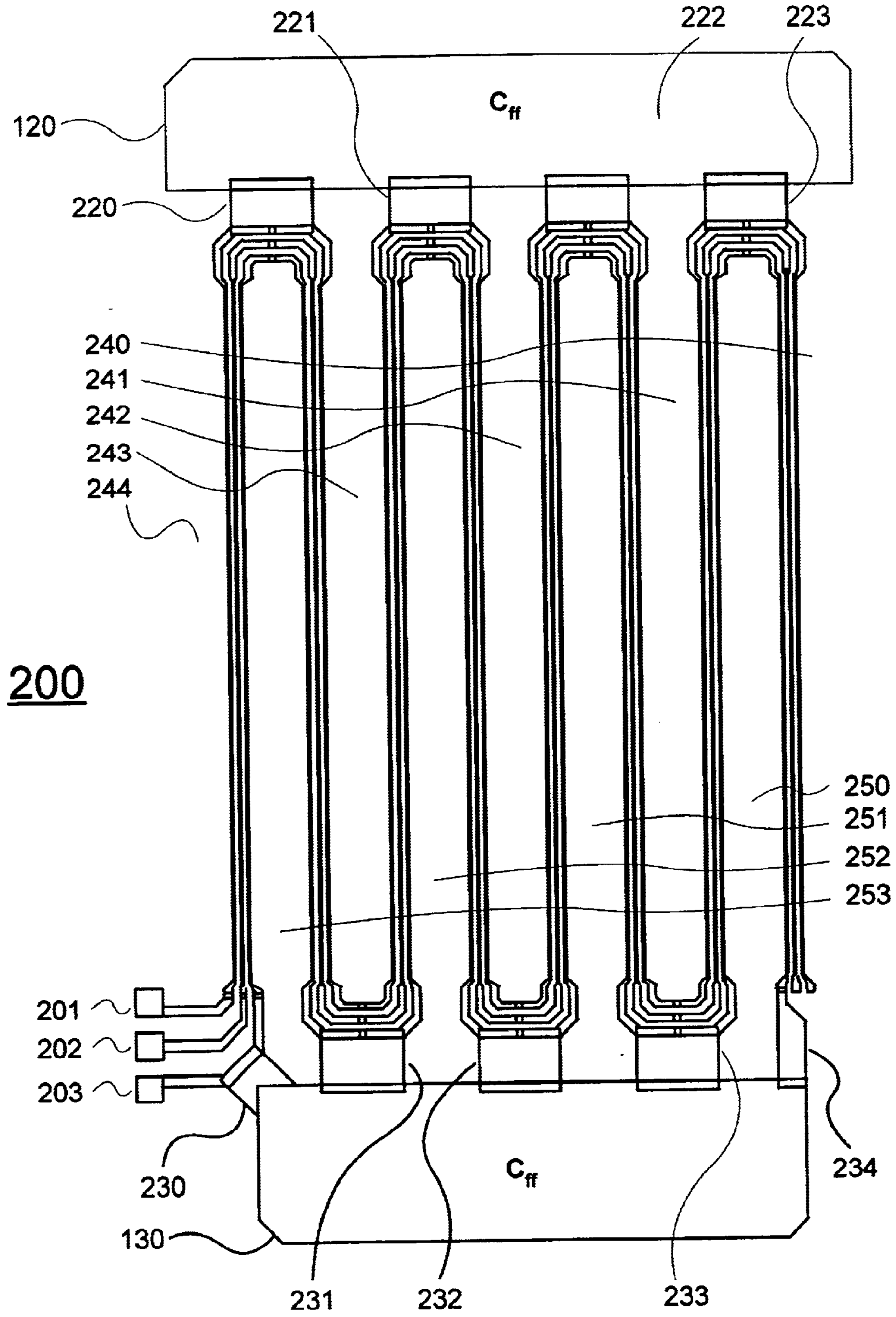
FIG. 2 is a physical layout diagram depicting the preferred embodiment of the invention, with multiple injection points of the feed forward signal.

FIG. 2 illustrates a preferred embodiment 200 of the physical layout of the present invention, which includes feed forward capacitors 120 and 130. The interdigitated drain fingers 240–244 and source fingers 250–253 are also shown. FIG. 2 shows three gate lines, 201, 202, and 203. Also shown are electrical coupling points 220–223 and 230–234.

The feed forward capacitors 120 and 130 are sized so that they present a relatively small impedance at the normal operating frequency of the FET. Since they are capacitors, the control voltage applied to the gate will not pass through them. At frequency bands currently in use with cellular telephony, a capacitor of two picofarads is typically used, to permit the RF signal to pass through.

The three gate lines and their associated connection points 201, 202, and 203 bend their way around the end of some of the interdigitated fingers of the drain 241–243, and all of the source fingers 250–253, and pass over the top of the channels between the drain 240–244 and source 250–253 fingers. Multiple coupling points 220–223 are shown to the upper gate line 201 at the bends nearest to the upper feed forward capacitor 120. The drain is electrically coupled to the feed forward capacitor 120. Preferably, this gate line 201 is the gate line located closest in the channel to the drain interdigitated fingers 240–244. Similar multiple coupling points 230–234 are made from the lower feed forward capacitor 130 to the gate line 203 proximal to and surrounding the source interdigitated fingers 250–253. By injecting the feed forward signal at multiple points along the gate line instead of at a single point, a more uniform radio frequency signal potential is thereby maintained along the gate line. This causes all of the gates to pinch off every channel to the same degree when a large radio frequency signal is applied across the FET 200. Thus, the invention eliminates the weakest channel in the FET from producing undesirable harmonic signals, and enables the FET 200 to attain harmonic suppression performance unachieved in the prior art.

Figure 3:
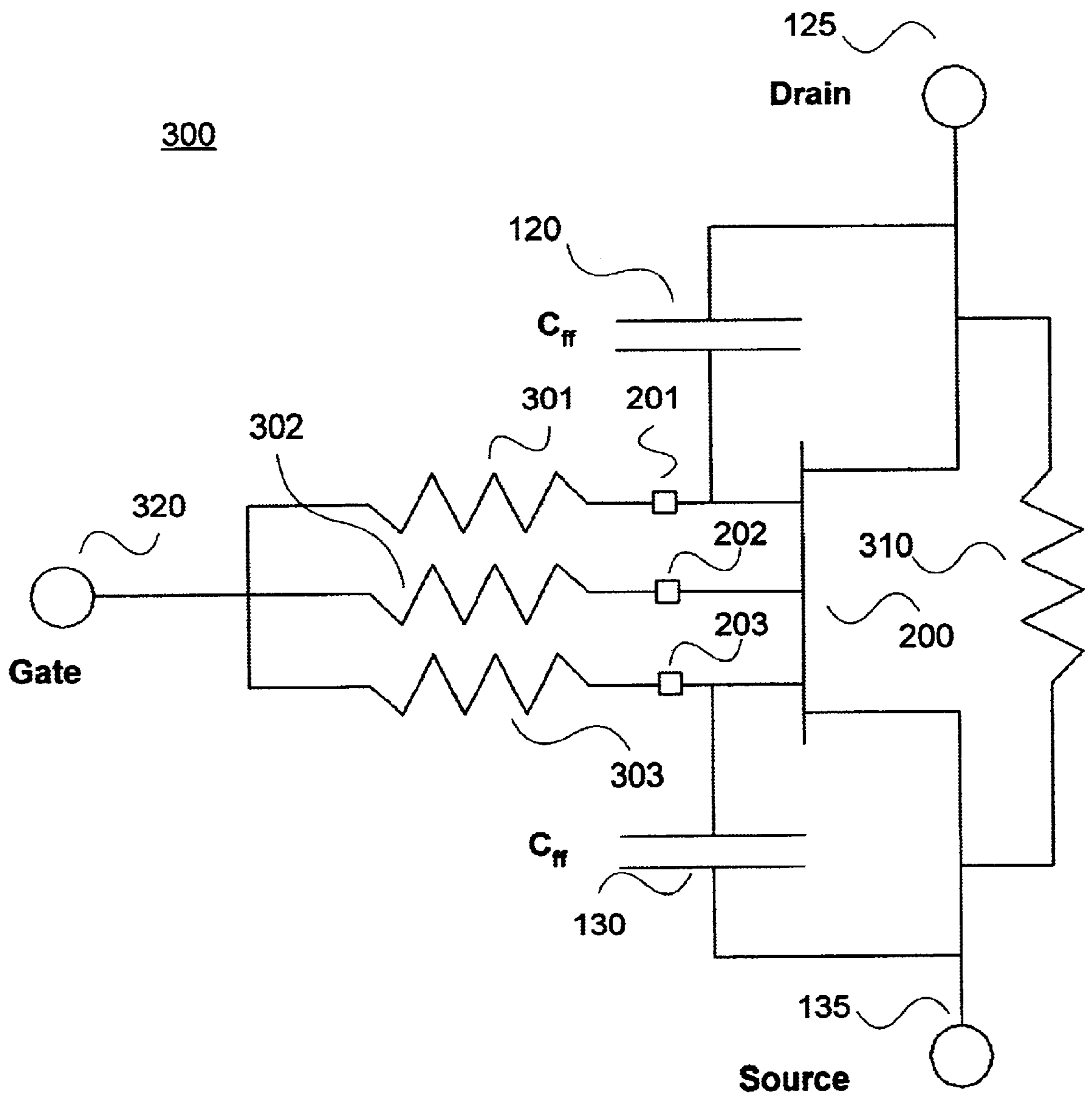
FIG. 3 is a schematic diagram depicting a triple gate FET circuit in accordance with a preferred embodiment of the present invention.

FIG. 3 illustrates an electrical schematic diagram for the present invention 300. For illustrative purposes, the drain 125 is shown at the upper terminal of the FET 200, and the source 135 is shown at the bottom. FIG. 3 also illustrates gate line resistors 301–303, a gate terminal 320, feed forward capacitors 120 and 130, gate line coupling points 201–203 and an external resistor 310.

Comparison of the elements presented in FIG. 3 can be made with the corresponding physical layout depicted in FIG. 2. The gate terminal 320 is connected through resistors 301, 302 and 303 (not shown on FIG. 2) to gate connection points 201, 202, and 203. The source terminal 135 shown at the lower end of the FET 200 is connected to the lower feed forward capacitor 130. The drain terminal 125 shown at the upper end of the FET 200 is connected to the upper feed forward capacitor 120. An external resistor 310 (not shown on FIG. 2) is connected between the drain 125 and source 135 terminals.

Finally, it should be noted that certain variations in the placement of the coupling points, the number of coupling points between the gate line and the feed forward capacitor, the shape of the gate line, and the number of gate lines present will be apparent to one of skill in the art upon reading the present specification. These variations are included within this invention and within the scope of the appended claims.

A Performance Test Example

Figure 4:
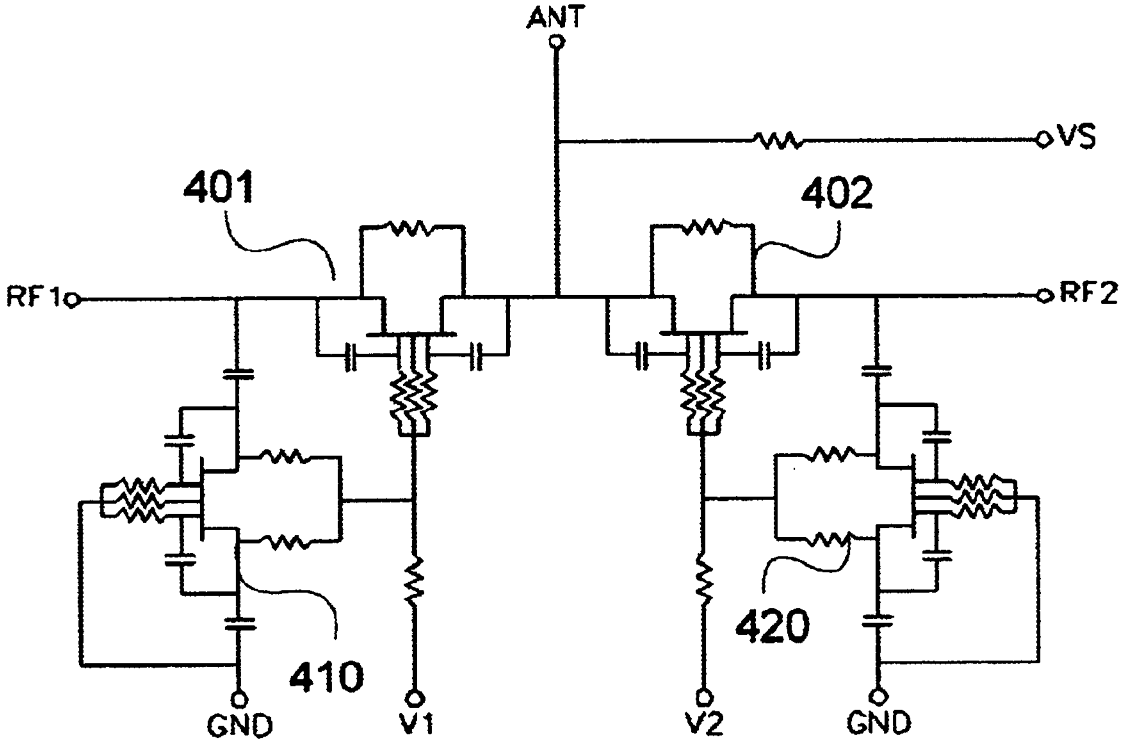
FIG. 4 is a schematic diagram of an SPDT switch using triple gate switches as in FIG. 3; and, FIG. 5 is a graph showing the harmonic suppression performance results of the switch shown in FIG. 4.

To illustrate the effectiveness of the invention, the inventive FET 300 was incorporated into a typical SPDT switch circuit, schematically depicted in FIG. 4. The high power, series switching FETs 401 and 402 used are the inventive FET 300 shown in the schematic circuit diagram FIG. 3. FIG. 4 also shows shunt FETs 410 and 420. Tests were conducted to determine the harmonic performance of the invention 300 in this arrangement.

Figure 5:
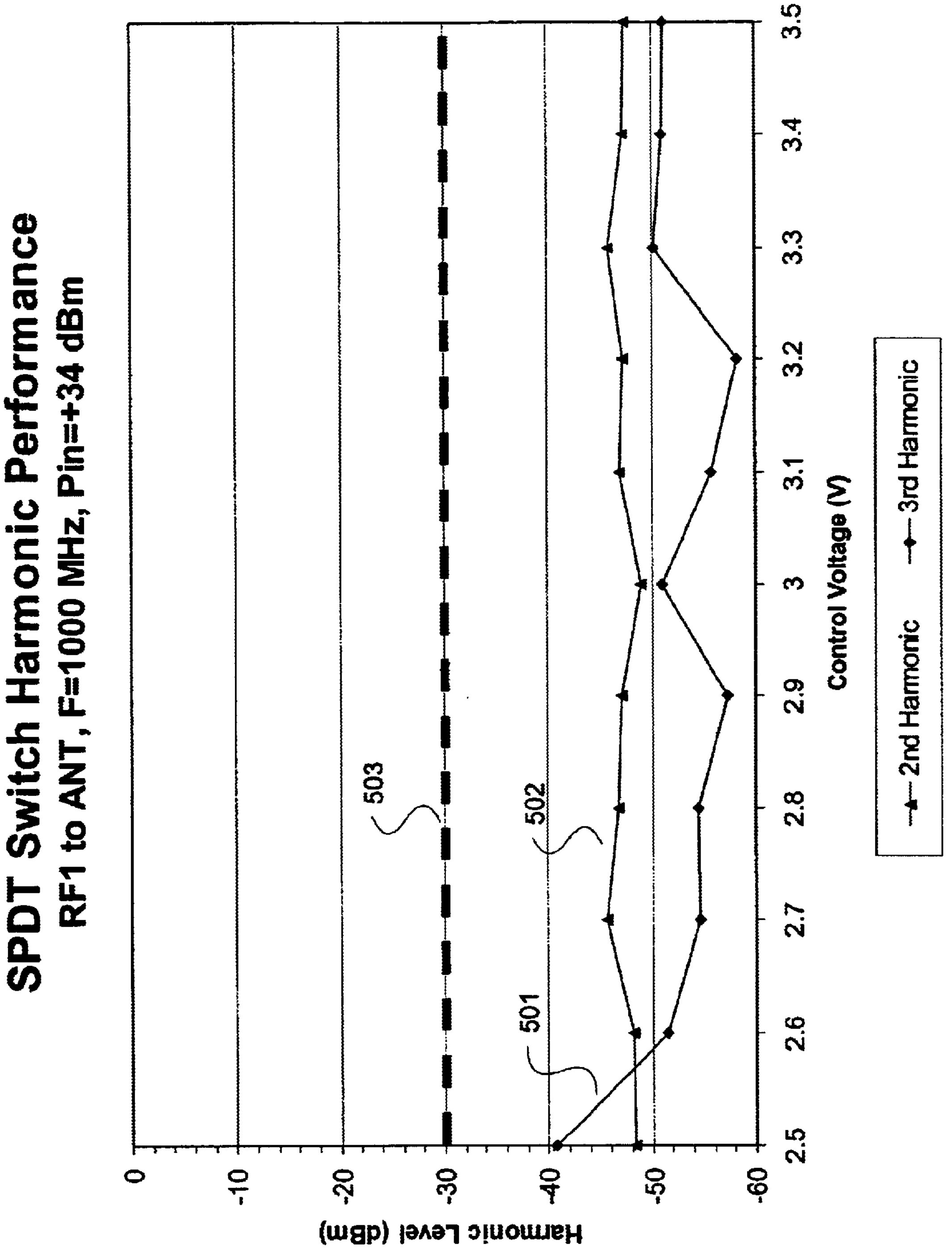

FIG. 5 shows the harmonic performance of the circuit incorporating the invention 300. From observation of the graph, one can easily ascertain that both the second 501 and third 502 harmonics are suppressed well below the required level 503 of −30 dBm for a variety of control voltages ranging from 2.5 to 3.5 Vdc. Other tests have been conducted with the application of this invention in other combinations (i.e., SP3T, SP4T, SP5T) and were found to yield harmonic performance consistent with these results. Thus, one notes that the invention can be incorporated into radio frequency switches with any number of poles or throws and the switch will maintain the same level of harmonic suppression.

Alternate Embodiments

This linearization technique can also be used in any high power or even low power applications where the length of the gate line presents a signal attenuation problem. Gate line impedance that attenuates a relatively high frequency signal arises from a relatively long and narrow gate line. These factors tend to increase the gate impedance per unit of gate line. Therefore, this invention is not limited to serpentine gate lines, but may be used in any gate line arrangement where the gate line causes signal attenuation.

Although this linearization technique was specifically developed for gallium arsenide FETs using a pseudomorphic high electron mobility transistor (PHEMT) manufacturing process, it can be used in designs of other gallium arsenide FETs manufactured by different processes such as metal semiconductor FETs (MESFET) or junction FETs (JFET). This is true because multiple feed forward to gate line coupling points are a function of layout geometry and not the materials used. This linearization technique will thus improve the harmonic performance of any depletion mode FET devices created by the aforementioned manufacturing processes known at the present, or other processes currently unknown.

One with skill in the art will recognize that variations in the embodiments presented above may be used to implement the invention. While the invention has been described in conjunction with specific embodiments, it is evident that numerous alternatives, modifications, and variations will be apparent to those persons skilled in the art in light of the foregoing description.

What is claimed is:

1. A field effect transistor comprising:

a plurality of gate lines, a source terminal electrically coupled to a source finger, a drain terminal electrically coupled to a drain finger, a first end of a first feed forward capacitor electrically coupled to the source terminal and at a second end electrically coupled to at least one gate line at a first plurality of points along the at least one gate line, and, a first end of a second feed forward capacitor electrically coupled to the drain terminal and at a second end electrically coupled to the at least one gate line at a second plurality of points along the at least one gate line.

2. The transistor of claim 1, wherein the points in the first plurality of points and the second plurality of points are spaced apart by about 400 microns along the length of a gate line.

3. The transistor of claim 1, wherein the points in the first plurality of points and the second plurality of points are spaced apart by about 200 microns along the length of a gate line.

4. The transistor of claim 1, whereby the capacitance of the first and second feed forward capacitors correspond to a harmonic suppression of second and third harmonics of less than −30 dBm at 1000 MHz with an applied control voltage of 2.5 Vdc to 3.5 Vdc.

5. The transistor of claim 1, wherein the points in the first plurality of points and the second plurality of points are spaced apart by no more than a distance selected from the group consisting of about 100, about 200, about 250, about 300, about 350, about 380, about 400, about 420, about 450 and about 500 microns along the length of a gate line.

6. The transistor of claim 5, wherein the first plurality of points and the second plurality of points are not on a common gate line.

7. The transistor of claim 6, wherein the first feed forward capacitor is coupled at the second end to a gate line nearest to the source finger and the second feed forward capacitor is coupled at the second end to a gate line nearest to the drain finger.

8. The transistor of claim 7, comprising three or more gate lines.

9. The transistor of claim 5, having a periphery of at least 400 microns.

10. The transistor of claim 9, whereby the capacitance of the first and second feed forward capacitors correspond to an insertion loss of the transistor of less than 0.25 dB at 1000 MHz and 2000 MHz with an applied control voltage of 2.5 Vdc to 3.5 Vdc.

11. The transistor of claim 1, having a substrate material comprising gallium arsenide.

12. The transistor of claim 11, wherein the transistor is prepared using a pseudomorphic high electron mobility process.

13. The transistor of claim 11, wherein the gate line is a Schottky barrier.

14. The transistor of claim 11, wherein the gate line is a junction.

15. The transistor of claim 1, wherein the source and drain terminals are electrically coupled to a plurality of interdigitated source and drain fingers respectively.

16. A method of switching a radio frequency signal having a signal strength of greater than 24 dBm and preferably up to 35.5 dBm, comprising:

providing a field effect transistor as a series switching device, the transistor comprising:

a plurality of gate lines, a source terminal electrically coupled to a source finger, a drain terminal electrically coupled to a drain finger, a first end of a first feed forward capacitor electrically coupled to the source terminal and at a second end electrically coupled to at least one gate line at a first plurality of points along the line, and, a first end of a second feed forward capacitor electrically coupled to the drain terminal and at a second end electrically coupled to at least one gate line at a second plurality of points along the line.

17. The method of claim 16, wherein the transistor further comprises having the points in the first plurality of points and the second plurality of points spaced apart by no more than a distance selected from the group consisting of about 100, about 200, about 250, about 300, about 380, about 400, about 420, about 450, and about 500 microns along the length of a gate line.

18. The method of claim 16, wherein the transistor further comprises having the points in the first plurality of points and the second plurality of points spaced apart by about 400 microns along the length of a gate line.

19. The method of claim 16, wherein the transistor further comprises having the points in the first plurality of points and the second plurality of points spaced apart by about 200 microns along the length of a gate line.

20. The method of claim 16, comprising the additional step of switching the transistor with a 2.5 Vdc to 3.5 Vdc control signal and wherein the transistor's harmonic suppression of second and third harmonics is less than −30 dBm at 1000 MHz.

* * * * *